US006417653B1

(12) United States Patent
Massie et al.

(10) Patent No.: US 6,417,653 B1
(45) Date of Patent: *Jul. 9, 2002

(54) DC-TO-DC CONVERTER

(75) Inventors: Harold L. Massie, West Linn; Edward L. Payton, Portland; Robert D. Wickersham, Hillsboro, all of OR (US)

(73) Assignee: Intel Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 454 days.

(21) Appl. No.: 08/848,842

(22) Filed: Apr. 30, 1997

(51) Int. Cl.[7] .............................. G05F 1/40; G05F 1/44
(52) U.S. Cl. ....................................... 323/282; 323/285
(58) Field of Search ................................ 323/282, 285, 323/284, 286

(56) References Cited

U.S. PATENT DOCUMENTS

| 4,001,721 A | | 1/1977 | Fukuda ........................ 331/111 |
| 4,009,432 A | | 2/1977 | Dingwall et al. ............ 307/296 |
| 4,161,023 A | * | 7/1979 | Goffeau ....................... 363/124 |
| 4,355,277 A | * | 10/1982 | Davis et al. ................. 323/285 |
| 4,618,812 A | * | 10/1986 | Kawakami ................... 323/285 |
| 5,267,218 A | | 11/1993 | Elbert ......................... 363/226 |
| 5,301,097 A | | 4/1994 | McDaniel .................... 363/60 |
| 5,386,200 A | | 1/1995 | Limberg ...................... 330/288 |
| 5,404,096 A | | 4/1995 | Thiel ........................... 323/312 |
| 5,410,267 A | | 4/1995 | Haycock et al. ............. 326/81 |
| 5,428,524 A | | 6/1995 | Massie ......................... 363/79 |
| 5,455,501 A | | 10/1995 | Massie ......................... 323/267 |
| 5,497,119 A | | 3/1996 | Tedrow et al. .............. 327/540 |
| 5,534,771 A | | 7/1996 | Massie ......................... 323/285 |
| 5,546,042 A | | 8/1996 | Tedrow et al. .............. 327/538 |
| 5,587,650 A | | 12/1996 | Massie ......................... 323/282 |
| 5,592,071 A | | 1/1997 | Brown | |
| 5,623,198 A | | 4/1997 | Massie et al. ............... 323/282 |
| 5,627,413 A | | 5/1997 | Mughir et al. ............... 307/86 |
| 5,650,715 A | | 7/1997 | Massie ......................... 323/273 |

(List continued on next page.)

FOREIGN PATENT DOCUMENTS

| EP | 0 120 103 | 3/1984 |
| EP | 0 146 855 | 3/1985 |
| GB | 2093283 A | 8/1992 |
| JP | 62037072 A | 2/1987 |
| WO | WO 86/04188 | 7/1986 |
| WO | WO 87/04575 | 7/1987 |

OTHER PUBLICATIONS

US 5,805,908, 09/1998, Massie (withdrawn)
Motorola Semiconductor, "Synchronous Rectification DC/DC Converter Programmable Integrated Controller", MC33470 Rev 1, Feb. 26, 1997, pp. 1–14.
Linear Technology Corporation, "High Efficiency Low Noise Synchronous Step–Down Switching Regulator", Apr. 1996, pp. 1–16.

*Primary Examiner*—Bao Q. Vu
(74) *Attorney, Agent, or Firm*—Howard A. Skaist

(57) ABSTRACT

Briefly, in accordance with one embodiment of the invention, a DC-to-DC converter includes: a circuit configuration to modify the set point of the output voltage signal level of the DC-to-DC converter circuit in response to a transient signal by an amount related, at least in part, to the magnitude of the transient signal. Briefly, in accordance with yet another embodiment of the invention, a DC-to-DC converter circuit includes: a high-side and a low-side voltage switching device. The switching devices are coupled in a circuit configuration to apply a control voltage signal to each switching device based, at least in part, on the state of the other switching device.

19 Claims, 2 Drawing Sheets

U.S. PATENT DOCUMENTS

| | | | | |
|---|---|---|---|---|
| 5,670,865 A | * | 9/1997 | Farwell | 323/285 |
| 5,678,049 A | | 10/1997 | Massie | 395/750 |
| 5,721,483 A | * | 2/1998 | Kolluri et al. | 323/224 |
| 5,764,047 A | | 6/1998 | Massie | 324/117 R |
| 5,777,461 A | | 7/1998 | Massie et al. | 323/282 |
| 5,808,377 A | | 9/1998 | Massie | 307/80 |
| 5,811,889 A | | 9/1998 | Massie | 307/44 |
| 5,822,166 A | | 10/1998 | Massie | |
| 5,831,405 A | | 11/1998 | Massie | |
| 5,845,141 A | | 12/1998 | Massie | |
| 5,889,387 A | | 3/1999 | Massie | |

* cited by examiner $\Delta V_3 \approx 2\Delta V_1$ $\Delta V_4 \approx 2\Delta V_2$

DC-TO-DC CONVERTER

BACKGROUND OF THE INVENTION

1. Field of the Invention

The present invention relates to voltage converters and, more particularly, to DC-to-DC voltage converters.

2. Background Information

Direct-current (DC) to direct-current (DC) converters are well-known in the art. Such circuitry or devices are typically employed to convert from one DC voltage signal level to another DC voltage signal level. This may be useful in a variety of environments.

One situation that is frequently an issue with such converters occurs when a sizable load is applied to the converter. A relatively sudden increase in load may be approximated as a step function and, as is well-known, typically results in a transient voltage signal in the circuitry to which the step function is applied. Therefore, typically a transient voltage signal will occur in those situations in which a sudden increase in load is applied to a DC-to-DC converter. Such transients, however, are undesirable because one of the functions of a DC-to-DC converter is to maintain an output voltage signal level within a particular voltage signal window or set of voltage signal boundaries to ensure, for example, that the operation of the circuitry being powered by the DC-to-DC converter is not substantially affected by the sudden increase in load.

One way that state of the art DC-to-DC converters address this situation is by employing bulk capacitance. Therefore, when a transient results from the application of a sizable load, the capacitors release stored charge to compensate at least partially for the transient voltage signal and to provide the DC-to-DC converter additional time to adjust to the increase in load.

Unfortunately, the use of bulk capacitance has several disadvantages. For example, such capacitance takes up additional room in the system in which the DC-to-DC converter is being employed. Likewise, in production, adding this bulk capacitance to the circuitry is relatively inconvenient and, therefore, also introduces additional expense and time in the production process. Therefore, it would be desirable if a technique or method were available to reduce the amount of capacitance employed with a DC-to-DC converter while still providing the capability of the DC-to-DC converter to maintain the output voltage signal level within the desired voltage signal window or voltage signal level bounds even when a sizable or significant load is applied.

SUMMARY OF THE INVENTION

Briefly, in accordance with one embodiment of the invention, a DC-to-DC converter includes: a circuit configuration to modify the set point of the output voltage signal level of the DC-to-DC converter circuit in response to a transient signal by an amount related, at least in part, to the magnitude of the transient signal.

Briefly, in accordance with yet another embodiment of the invention, a DC-to-DC converter circuit includes: a high-side and a low-side voltage switching device. The switching devices are coupled in a circuit configuration to apply a control voltage signal to each switching device based, at least in part, on the state of the other switching device.

BRIEF DESCRIPTION OF THE DRAWINGS

The subject matter regarded as the invention is particularly pointed out and distinctly claimed in the concluding portion of this specification. The invention, however, both as to organization, and method of operation, together with objects, features, and advantages thereof, made best be understood by reference to the following detailed description, when read with the accompanying drawings in which:

DETAILED DESCRIPTION OF THE INVENTION

In the following detailed description numerous specific details are set forth in order to provide a thorough understanding of the invention. However, it will be understood by those skilled in the art that the present invention may be practiced without these specific details. In other instances, well-known methods, procedures, components, and circuits have not been described in detail so as not to obscure the present invention.

Figure 1:
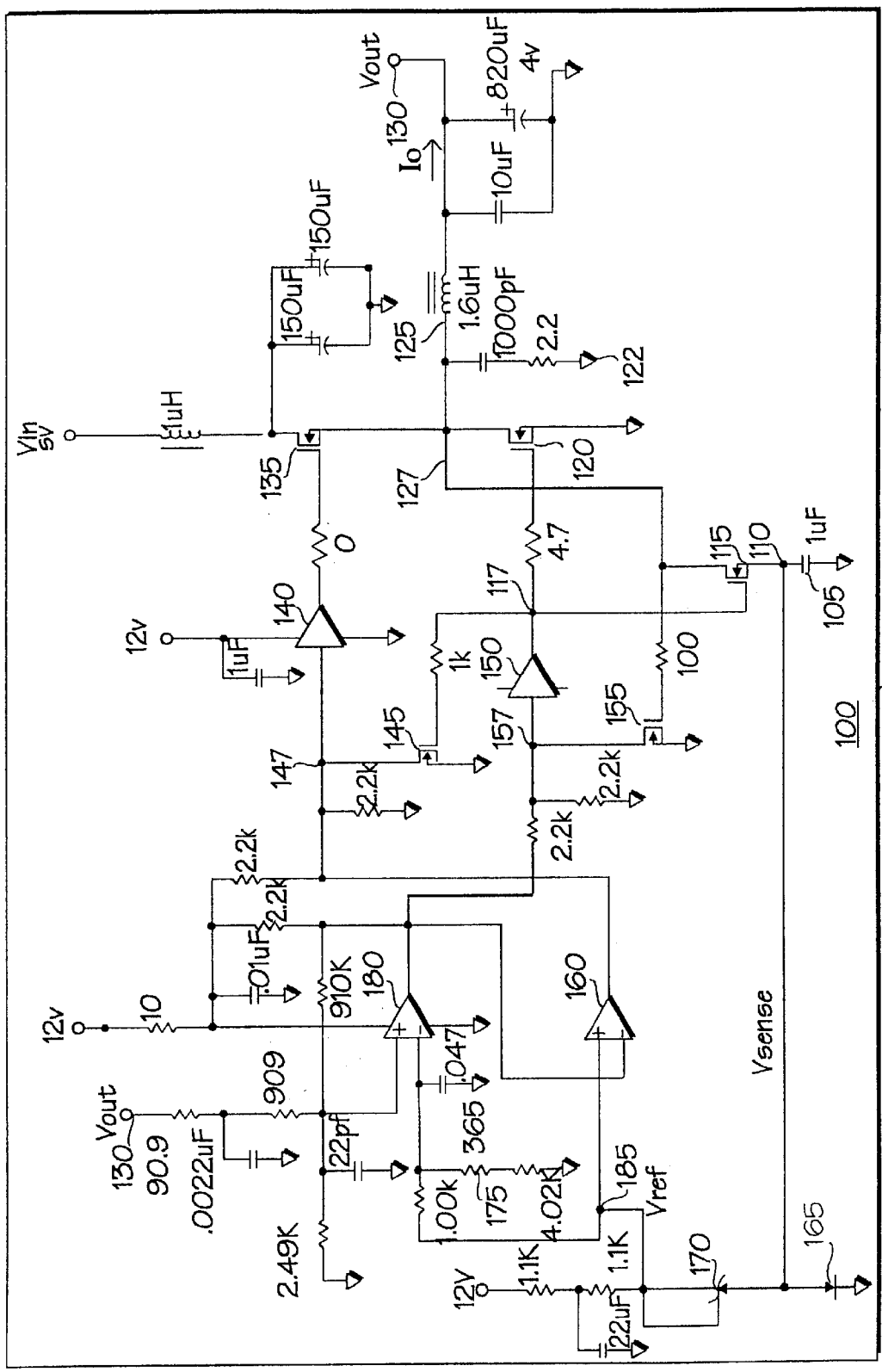
FIG. 1 is a circuit diagram illustrating an embodiment of a DC-to-DC converter in accordance with the present invention.

FIG. 1 is a circuit diagram illustrating an embodiment 100 of a DC-to-DC converter in accordance with the present invention. The embodiment illustrated in FIG. 1 comprises a synchronous rectifier circuit. Synchronous rectifier circuits are well-known and will not be discussed further. See, for example, Initial Release, Final Electrical Specifications, LTC 1435, "High Efficiency Low Noise Synchronous Step-Down Switching Regulator," published April, 1996, available from Linear Technology Corp., Milpitas, Calif. and Technical Data, Product Preview, MC33470, "Synchronous Rectification DC/DC Converter Programmable Integrated Controller," published Feb. 26, 1997, available from Motorola, Inc., Schaumburg, Ill., both herein incorporated by reference. As previously discussed, one state of the art approach to at least partially compensate for transient voltage signals includes the use of bulk capacitance. Therefore, during operation, when a sizable or substantial load is applied to the DC-to-DC converter, the capacitors discharge to at least partially offset the transient voltage signal and provide additional time for the DC-to-DC converter to adjust to the increase in load. However, it is desirable to reduce the amount of capacitance employed to maintain the DC voltage signal level within a predetermined or selected voltage signal window during such transients.

The embodiment illustrated in FIG. 1 comprises a circuit configuration to adjust the output voltage signal level of the DC-to-DC converter as a function of the output current signal. As shall be discussed in greater detail hereinafter, for this embodiment of a DC-to-DC converter in accordance with the invention, higher current signal levels lower the output voltage signal level by a proportional amount. This adjustment of output voltage signal level provides increased voltage margin to respond to load changes producing output current signal changes.

As is well-known, DC-to-DC converters may be employed in a variety of situations, circuits and embodiments. Therefore, the invention is not limited in scope to any particular application of a DC-to-DC converter. One application includes, without limitation, a DC-to-DC converter employed with a microprocessor or other processor. In such an embodiment, a DC-to-DC converter may experience an increase in load, for example, when the microprocessor transitions from a "sleep" mode to a mode in which a floating point calculation is performed, although again the invention is not limited in scope in this respect. This is intended as one example to illustrate a typical application of a DC-to-DC converter and, as previously indicated, does not limit the scope of the invention in any way. In a situation such as previously discussed, it is desirable to maintain the output voltage signal level of the DC-to-DC converter within a predetermined voltage signal window or within pre-established output voltage signal level bounds.

The embodiment illustrated in FIG. 1 is illustrated as embodied on an integrated circuit chip (IC), although the invention is not limited in scope in this respect. Embodiment 100 illustrated in FIG. 1 effectively adjusts the set point of the output voltage signal level in response to a voltage signal transient, such as from an increase in load. In this context, set point refers to a voltage signal level about which the circuit tends to operate in equilibrium. By having the capability to adjust the set point of the output voltage signal level, the output voltage signal may be set within the predetermined window at a voltage signal level providing additional voltage margin to respond to an increase in load if one should occur. With this additional voltage margin, less capacitance may be employed because the additional voltage margin may be employed to at least partially offset the transient voltage signal. Likewise, the amount to adjust the set point to provide additional margin is sensed based, at least in part, upon the DC-to-DC converter output current signal level. Therefore, this amount is related, at least in part, to the magnitude of the transient voltage signal.

Current sensing in this particular embodiment is performed by field effect transistor (FET) 115 and capacitor 105. Of course, the invention is not limited in scope to FETs. Likewise, the term capacitor is not limited to discrete circuit elements having capacitive electrical properties. When FET 120 is "on", such as when a control voltage signal is applied to its gate having a magnitude sufficient to allow conduction between the source and the drain, the load current passes between the source and drain of FET 120. In full conduction, an FET, such as FET 120, as previously described, operates like a resistor. Therefore, the voltage drop across the FET equals the current conducting through it times the "on" resistance of the FET. In this embodiment, at about the same time, a sampling switch in the form of another FET, FET 115, is also turned "on". Thus, capacitor 105 stores a voltage corresponding to the voltage drop across FET 120. Capacitor 105 has, therefore, sampled the voltage drop across FET 120, which in this embodiment is proportional to the load current signal, as previously described.

This sampled voltage signal comprises a negative voltage because the load current, designated $I_0$ in FIG. 1, flows through FET 120 into inductor 125 to support the current to Vout. Due to the operation of the synchronous rectifier circuit and during the time FET 135 is "on" and current flows through FET 135 to inductor 125, inductor 125 stores the current and an electromagnetic field is created. Therefore, when FET 135 is turned off and FET 120 is turned "on", inductor 125 operates to maintain current flow in the same direction. The electromagnetic field that had been created by inductor 125 therefore collapses. This results in inductor 125 switching polarity. As a result, the voltage signal at node 127 in FIG. 1 comprises a negative voltage with respect to ground 122, as illustrated. This negative voltage signal is proportional to the "on" resistance of FET 120 times the current flow, as previously described. One advantage of this approach to sensing the load current signal is that it reduces the amount of power dissipated in comparison with the use of a resistor, for example. Likewise, the load current signal is employed to determine how much to offset the set point of the output voltage signal level to provide additional margin, as described in more detail hereinafter.

In FIG. 1, the voltage across capacitor 105 is referred to as $V_{sense}$. This voltage signal is proportional to the "on" resistance of FET 120, as previously described. Likewise, if desirable, the voltage signal may be adjusted, such as by using a resistor voltage divider, for example. As illustrated in FIG. 1, capacitor 105 is coupled to zener diode 170, although the invention is not limited in scope in this respect. $V_{ref}$ comprises the sum of the voltage across zener diode 170 and the voltage signal, $V_{sense}$. In this embodiment, diode 165 clamps $V_{sense}$ so that when the circuit is first energized $V_{ref}$ will not exceed a particular voltage signal level As the relationship in this embodiment between the output current signal and the negative voltage signal as previously described illustrates, $V_{ref}$ will tend to increase when the load current signal tends to decrease because the value of $V_{sense}$ will be less negative. Likewise, $V_{ref}$ will tend to decrease when the load current signal tends to increase. Therefore, through this mechanism, changes in the load current signal result in changes in $V_{ref}$. Likewise, changes in $V_{ref}$ result in changes in the set point of the output voltage signal of the DC-to-DC converter, as described below. Therefore, $V_{ref}$ comprises the set point reference voltage signal in this embodiment. For example, as illustrated in FIG. 1, $V_{ref}$ is supplied to the inverting input port of comparator 180 through a voltage divider including resistor 175. Likewise, output voltage signal 130 is applied to the noninverting input port of comparator 180 in this particular embodiment. Comparator 180 maintains the two voltage signals applied to its two input ports approximately equal. As a result, when $V_{ref}$ decreases, for example, by 1/10 of a volt, likewise, the set point for the output voltage signal decreases due to the operation of comparator 180. Likewise, under approximately zero or substantially no loading conditions, this configuration, including the voltage divider including resistor 175, results in a set point of the output voltage signal above a nominal voltage, such as midway between the two voltage signal bounds, for example, so that additional voltage margin is available for the output voltage signal level to fall if a load is applied, as previously described.

Of course, the invention is not limited in scope to this particular embodiment. For example, the voltage divider including resistor 175 may not be employed. The voltage signal level may be adjusted by using an amplifier configuration, for example, or, alternatively, the voltage signal level may not be adjusted. Likewise, in an alternative embodiment, the negative voltage signal may be sampled on the high-side of the DC-to-DC converter rather than the low-side sampling illustrated in FIG. 1; however, such an approach may involve more complex circuitry to measure the voltage drop across transistor 135 and to invert the polarity of the voltage signal.

Embodiment 100 of a DC-to-DC converter in accordance with the present invention also includes a technique to prevent cross-conduction in the output stage of a DC-to-DC converter including a synchronous rectifier, while reducing losses due to dead time of the synchronous rectifier circuit. In this particular embodiment, the DC-to-DC converter includes a high-side voltage switching device and a low-side voltage switching device. Transistor 135 comprises the high-side switching device in this particular embodiment and transistor 120 comprises the low-side switching device in this embodiment. Of course, the invention is not limited in scope to FETs, as previously indicated, or even to transistors. Likewise, the switching devices are coupled in a circuit configuration to apply a control voltage signal to each switching device based, at least in part, on the state of the other switching device. In this context, the term state refers to whether a particular signal is high or low; however, the invention is not restricted in scope to the particular conventions employed in this embodiment to signal a particular state. Likewise, in an alternative embodiment, different states may be employed.

For example, as illustrated in FIG. 1, it is desirable that transistor 135 and transistor 120 not conduct current at the same time, referred to in this context as cross-conduction. Otherwise, current will conduct to ground from the port to which Vin is applied, which is not desirable. If the control voltage signal applied to the gate of transistor 135 is high, then transistor 135 conducts current. Therefore, the voltage signal at node 127 will approximately equal the input voltage signal, Vin. With the voltage signal at 127 high, transistor 155 will also conduct current because the voltage signal at 127 is applied as a control voltage signal to the gate of transistor 155. Because transistor 155 conducts current, the voltage signal at node 157 will approximately equal the ground voltage level, which will clamp the input port of driver 150 low so the driver does not apply a control voltage signal to transistor 120 that will result in the conduction of current through transistor 120. Therefore, transistor 120 is "off." Even if the output signal of inverter 180 becomes high, because transistor 155 conducts current, the voltage signal at node 157 will be low and transistor 120 will be "off" until transistor 135 is "off", resulting in the voltage signal at node 127 transitioning from a high state to a low state.

When the output signal of comparator 180 becomes high, the output signal of inverter 160 will transition to a low output signal or low state. Therefore, a low control voltage signal is applied to the gate of transistor 135, which will ultimately stop or substantially stop the conduction of current through transistor 135 and, therefore, turn the transistor "off". The amount of time it takes to turn off transistor 135 will be determined, at least in part, by the operating characteristics of driver 140 and transistor 135 in this particular embodiment. As a result of transistor 135 no longer conducting current and the change in polarity of inductor 125 previously described, the voltage signal at node 127 will transition to ground. Therefore, transistor 155 will turn "off". As a result, the voltage signal at 157 is no longer coupled to ground and this will allow the voltage signal at node 157 to transition to a high state. Likewise, the output signal produced by driver 150 will transition high and be applied to transistor 120 and transistor 145. Therefore, transistors 120 and 145 will conduct current. Transistor 145 will clamp the input port of driver 140 low so transistor 135 does not conduct current. Therefore, transistor 135 does not conduct current while transistor 120 conducts current. This situation may be maintained until the voltage signal at node 117 transitions to a low state. When comparator 180 senses that the output voltage level, Vout, is too low, its output signal will transition to a low state. As a result, the output signal of comparator 160 will transition to a high state. However, the voltage signal at node 147 will be held in a low state because transistor 145 is conducting current. The signal applied to gate of transistor 120 will transition to a low state due to the output signal of driver 150, which will turn "off" both transistor 145 and transistor 120. By turning "off" transistor 145, the voltage signal at 147 will transition to a high state, which will apply a high signal to the input port of driver 140 and, therefore, a high signal will be applied to the gate of transistor 135, resulting in that transistor conducting current.

As the previous description indicates, the conduction of transistors 145 and 155 results in clamping the input ports of drivers 140 and 150 respectively to a low state during a transfer of states between transistors 135 and 120. As a result, cross-conduction is prevented. Also, the time that transistor 120 is "off" with the voltage signal at node 127 low is reduced to a time period depending, in this particular embodiment, at least in part, on the operating characteristics of driver 150 and transistor 120.

Low-side transistor 120 includes a diode that is activated and dissipates power when transistor 120 is "off". Therefore, it is desirable for the synchronous rectifier circuit to switch quickly while preventing cross-conduction, as previously described. An advantage of this particular embodiment in accordance with the invention is that, although the frequency at which a synchronous rectifier circuit may switch is affected by a number of parameters including loading conditions, this embodiment allows the transistors to switch quickly without cross-conduction occurring.

Figure 2A:
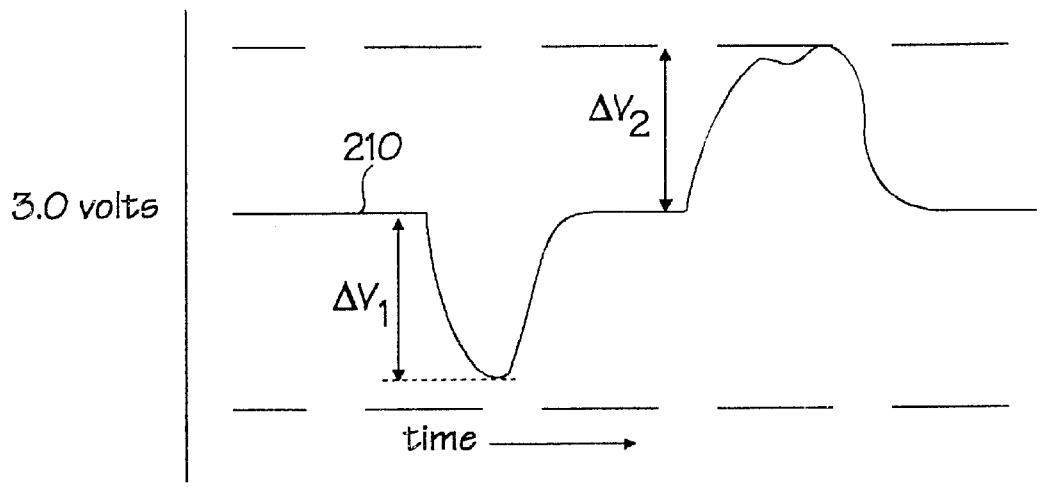
FIGS. 2a and 2b are plots respectively illustrating the output voltage signal produced by a conventional DC-to-DC converter and by the embodiment illustrated in FIG. 1.
Figure 2B:
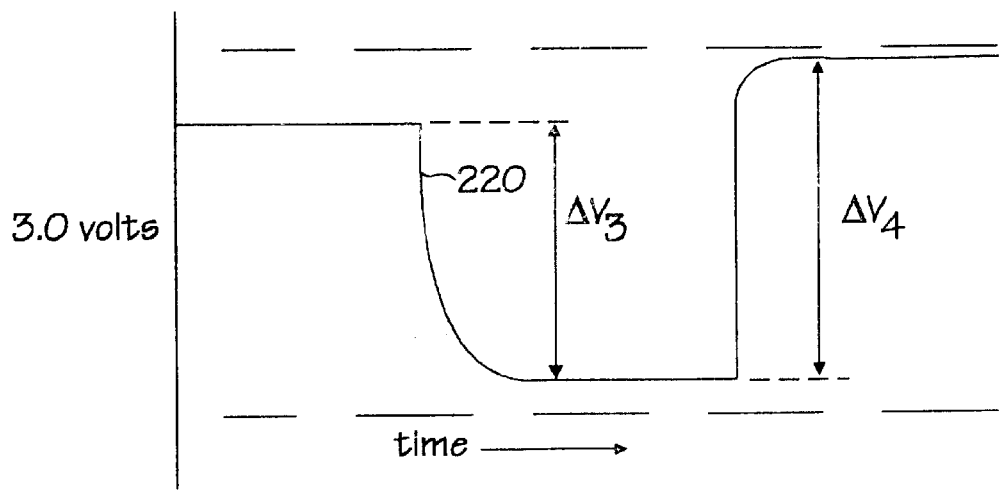

FIGS. 2a and 2b are plots illustrating, respectively, the output voltage signal level for a conventional DC-to-DC converter and for the embodiment illustrated in FIG. 1. Of course, these plots are idealized and provided here merely to illustrate operation rather than as an indication of actual results. As curve 210 in FIG. 2a illustrates, in a conventional DC-to-DC converter, the set point for the output voltage signal level is approximately midway between the two voltage signal bounds for the output voltage signal level, in this case around 3 volts. As previously described, to keep the converter from operating outside these bounds, bulk capacitance is typically employed. This capacitance discharges when the converter experiences an increase in load. The output voltage signal level changes as a function of the internal resistance of the capacitor as well as the discharge, providing the converter additional time to adjust to the increase in load without resulting in operation outside the voltage signal bounds. This is the situation illustrated in FIG. 2a.

FIG. 2b illustrates a change in load applied to the embodiment illustrated in FIG. 1 from a first load level to a second load level. Therefore, the set point of the DC-to-DC converter is modified. Under substantially no load conditions, the converter operates at a set point above that for a conventional converter. Therefore, the embodiment illustrated in FIG. 1 has additional voltage margin for an increase in load and, therefore, less capacitance may be employed. For this embodiment, the additional margin may allow the converter to approximately double the voltage signal swings.

An embodiment of a method of modifying the set point of the output voltage signal of a DC-to-DC converter circuit, in accordance with the invention, includes the following. As previously described, with respect to the embodiment illustrated in FIG. 1, a voltage signal related to the output current signal may be sampled. The set point of the output voltage signal of the DC-to-DC converter circuit may be adjusted based, at least in part, on the magnitude of the sampled voltage signal. Likewise, for the embodiment illustrated in FIG. 1, for example, the voltage signal sampled may comprise a negative voltage signal, although the invention is not limited in scope in this respect. For example, as previously described, a voltage signal may be sampled and then the polarity of the voltage signal may be inverted. Furthermore, for the embodiment illustrated in FIG. 1, adjusting the set point comprises adjusting a set point voltage signal, such as $V_{ref}$, illustrated in FIG. 1. Again, adjusting the set point reference voltage signal, such as $V_{ref}$, for the embodiment illustrated in FIG. 1 includes summing the set point reference voltage signal with the negative voltage signal, although the invention is not restricted in scope to this particular embodiment.

An embodiment of a method of preventing cross-conduction in the output stage of a DC-to-DC converter circuit including a synchronous rectifier circuit, in accordance with the invention, includes the following. A control voltage signal may be applied to one of a high-side and a low-side switching device based, at least in part, on the state of the other switching device, such as illustrated, with respect to switching devices 120 and 135 in FIG. 1. Therefore, for this particular embodiment, high-side and low-side switching devices comprise transistors and, in this particular embodiment, field-effect transistors (FETs). However, as previously described, the invention is not restricted in scope to employing transistors or field-effect transistors. Again, for the embodiment illustrated in FIG. 1, the control voltage signal of one of the switching devices is clamped in a low state while a state of the control voltage signal of the other switching device is high. Alternatively, the control voltage signal of the other switching device is clamped low while the state of the control voltage signal of the one switching device is high.

While certain features of the invention have been illustrated as described herein, many modifications, substitutions, changes and equivalents will now occur to those skilled in the art. For example, an embodiment in accordance with the invention may be implemented with bipolar transistors. It is, therefore, to be understood that the appended claims are intended to cover all such modifications and changes as fall within the true spirit of the invention.

What is claimed is:

1. A DC-to-DC converter circuit comprising: a circuit configuration to modify the set point of the output voltage signal of the DC-to-DC converter circuit in response to a transient signal by an amount related, at least in part, to the magnitude of the transient signal.

2. The DC-to-DC converter circuit of claim 1, and further comprising, as part of the circuit configuration, a portion to maintain the set point at a voltage signal level above a nominal voltage signal level midway between a first and a second voltage signal level during substantially no output loading conditions.

3. The DC-to-DC converter circuit of claim 1, wherein the circuit configuration is adapted to modify the set point by sampling a voltage signal related to the output current signal and adjusting a set point reference voltage signal based, at least in part, on said voltage signal related to the output current signal.

4. The DC-to-DC converter circuit of claim 3, wherein the sampled voltage signal comprises a negative voltage signal.

5. The DC-to-DC converter circuit of claim 1, wherein said DC-to-DC converter circuit comprises a synchronous rectifier circuit.

6. The DC-to-DC converter circuit of claim 1, wherein said DC-to-DC converter circuit is embodied on an integrated circuit chip.

7. The DC-to-DC converter circuit of claim 1, wherein said transient signal comprises one of a transient voltage signal and a transient current signal.

8. A DC-to-DC converter comprising: a high-side and a low-side switching device, the switching devices being coupled in a circuit configuration to prevent cross-conduction by applying a control voltage to each switching device based, at least in part, on the state of the other switching device;

wherein the circuit configuration is adapted to clamp the control voltage of each of said switching devices in a low state while a control voltage of the other switching device is in a high state.

9. The DC-to-DC converter circuit of claim 8, wherein at least one of said switching devices comprises a transistor.

10. The DC-to-DC converter circuit of claim 8, wherein said converter circuit comprises a synchronous rectifier circuit.

11. The DC-to-DC converter circuit of claim 8, wherein the circuit configuration is coupled so that the control voltage of the other switching device is also applied as the control voltage of another switching device so as to clamp said control voltage signal of each of said switching devices to ground while a control voltage of the other switching device is in a high state.

12. A method of modifying the set point of the output voltage signal of a DC-to-DC converter circuit comprising:

sampling a voltage signal related to the output current signal; and adjusting the set point based, at least in part, on the magnitude of the sampled voltage signal.

13. The method of claim 12, wherein sampling a voltage signal related to the output current signal comprises sampling a negative voltage signal.

14. The method of claim 13, wherein adjusting the set point based, at least in part, on the magnitude of the sampled voltage signal comprises adjusting a set point reference voltage signal.

15. The method of claim 14, wherein adjusting a set point reference voltage signal comprises summing the set point reference voltage signal with the negative voltage signal.

16. A method of preventing cross-conduction in the output stage of a DC-to-DC converter circuit including a synchronous rectifier circuit comprising:

applying a control voltage signal to each of a high-side and a low-side switching device based at least in part, on the state of the other switching device;

wherein said applying a control voltage signal includes clamping the control voltage signal of each of the high-side and the low-side switching devices in a low state while the other switching device is in a high state.

17. The method of claim 16, wherein said high-side switching device comprises a transistor and said low-side switching device comprises a transistor.

18. The method of claim 17, wherein the high-side transistor comprises a field-effect transistor (FET) and the low-side transistor comprises an FET.

19. The method of claim 16, wherein clamping the control voltage signal of each of the high-side and the low-side switching devices in a low state comprises clamping the control signal to ground.

* * * * *